(12) United States Patent
Marcu et al.

(10) Patent No.: US 8,995,194 B2
(45) Date of Patent: Mar. 31, 2015

(54) DIRECT MULTI-LEVEL CELL PROGRAMMING

(71) Applicant: Sandisk Technologies Inc., Plano, TX (US)

(72) Inventors: Alon Marcu, Tel-Mond (IL); Eran Sharon, Rishon Lezion (IL); Idan Alrod, Herzliya (IL); Yan Li, Milpitas, CA (US); Hadas Oshinsky, Kfar Saba (IL)

(73) Assignee: Sandisk Technologies Inc., Plano, TX (US)

( * ) Notice: Subject to any disclaimer, the term of this patent is extended or adjusted under 35 U.S.C. 154(b) by 0 days.

(21) Appl. No.: 14/509,602

(22) Filed: Oct. 8, 2014

(65) Prior Publication Data

US 2015/0023099 A1    Jan. 22, 2015

Related U.S. Application Data

(63) Continuation of application No. 14/283,030, filed on May 20, 2014, now Pat. No. 8,879,322, which is a continuation of application No. 13/598,264, filed on Aug. 29, 2012, now Pat. No. 8,885,410.

(51) Int. Cl.
| | | |
|---|---|---|
| *G11C 16/04* | (2006.01) | |
| *G11C 16/10* | (2006.01) | |
| *G11C 16/26* | (2006.01) | |

(52) U.S. Cl.
CPC ............ *G11C 16/10* (2013.01); *G11C 16/0483* (2013.01); *G11C 16/26* (2013.01)
USPC ............. 365/185.17; 365/185.33; 365/185.28

(58) Field of Classification Search
CPC ............... G11C 16/0483; G11C 16/10; G11C 16/3418; G11C 16/26; H01L 27/115

USPC .......................... 365/185.17, 185.33, 185.28
See application file for complete search history.

(56) References Cited

U.S. PATENT DOCUMENTS

| 7,539,063 B2 | 5/2009 | Kang et al. |
| 7,643,340 B2 | 1/2010 | Kong et al. |

(Continued)

FOREIGN PATENT DOCUMENTS

| WO | 2011075597 A1 | 6/2011 |
| WO | 2011146364 A2 | 11/2011 |
| WO | 2011153000 A2 | 12/2011 |

OTHER PUBLICATIONS

Trinh, Cuong et al. "A 7.8MB/s 64Gb 4-Bit/Cell NAND Flash Memory on 43nm CMOS Technology," 2009 IEEE International Solid-State Circuits Conference—Session 13.6, 37 pages.
International Search Report and Written Opinion of the International Searching Authority (EPO) for International Application No. PCT/US2013/049696, mailed Oct. 7, 2013, 12 pages.
Restriction Requirement mailed Apr. 21, 2014 in U.S. Appl. No. 13/598,264, 6 pages.
Notice of Allowance and Fee(s) Due mailed Jul. 7, 2014 in U.S. Appl. No. 14/283,030, 9 pages.

(Continued)

*Primary Examiner* — Jason Lappas
(74) *Attorney, Agent, or Firm* — Toler Law Group, PC

(57) ABSTRACT

A method is performed in a data storage device that includes a controller coupled to a non-volatile memory. The non-volatile memory includes a group of storage elements. Each storage element is configured to store multiple data bits. Data is sent from the controller to the non-volatile memory and first bits corresponding to a first portion of the data are stored into the group of storage elements during a first write stage. Each storage element of the group of storage elements stores at least one bit of the first bits upon completion of the first write stage. Second bits corresponding to a second portion of the data are sent to a second memory without sending the first bits to the second memory. The second bits are retrieved from the second memory and at least the second bits are stored into the group of storage elements during a second write stage.

19 Claims, 5 Drawing Sheets

(56) References Cited

U.S. PATENT DOCUMENTS

| | | |
|---|---|---|
| 7,995,387 B2 * | 8/2011 | Sharon et al. ............ 365/185.02 |
| 2010/0172180 A1 | 7/2010 | Paley et al. |
| 2011/0153919 A1 | 6/2011 | Sabbag |

OTHER PUBLICATIONS

Notice of Allowance and Fee(s) Due mailed Jul. 8, 2014 in U.S. Appl. No. 13/598,264, 10 pages.

* cited by examiner

300

3t — 310

| | Status | Action |
|---|---|---|
| WL(n+2) | Received from Host | Transfer to Latches |
| WL(n+1) | Basic Phase | NA |
| WL(n) | Intermediate Phase | NA |
| WL(n-1) | Final Phase | Program 3 bits into Final Phase |

3t+1 — 320

| | Status | Action |
|---|---|---|
| WL(n+2) | Basic Phase | 1. Program 1 bit into Basic Phase.<br>2. Write 2 bits to RAM. |
| WL(n+1) | Basic Phase | 1. Read 1 bit from Basic Phase.<br>2. Transfer 2 bits from RAM to Latches. |
| WL(n) | Intermediate Phase | NA |

3t+2 — 330

| | Status | Action |
|---|---|---|
| WL(n+2) | Basic Phase | NA |
| WL(n+1) | Intermediate Phase | 1. Program 2 bits into Intermediate Phase.<br>2. Write 1 bit to RAM. |
| WL(n) | Intermediate Phase | 1. Read 2 bits from Intermediate Phase.<br>2. Transfer 1 bit from RAM to Latches.<br>3. Free RAM. |

FIG. 3

DIRECT MULTI-LEVEL CELL PROGRAMMING

REFERENCE TO EARLIER-FILED APPLICATIONS

This application is a continuation of and claims priority to U.S. Non-Provisional patent application Ser. No. 14/283,030, filed May 20, 2014, which is a continuation of and claims priority to U.S. Non-Provisional patent application Ser. No. 13/598,264 filed Aug. 29, 2012. The contents of each of these applications are incorporated by reference herein in their entirety.

FIELD OF THE DISCLOSURE

The present disclosure is generally related to storing data in a multi-level cell (MLC) non-volatile memory.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, multi-level cell (MLC) flash memory devices provide increased storage density by storing 3 bits per cell, 4 bits per cell, or more. Data to be stored in a MLC memory may be first stored in a single-level cell (SLC) cache and later transferred from the SLC cache to the MLC memory during a background process. Alternatively, data may be written to the MLC memory in a direct-write operation.

Storing data in a MLC memory is conventionally performed using multi-stage write operations at multiple adjacent word lines of the MLC flash memory, alternating between the adjacent word lines to reduce an impact of cross-coupling effects. However, alternating between multiple word lines may require swapping data for the different word lines into a set of latches in a flash memory die to enable programming of the latched data to a particular word line. Providing sufficient temporary storage capacity (e.g. in a random-access memory) to store multiple sets of data that is swapped into and out of the latches during a direct-write operation increases the manufacturing cost of a data storage device. Further, repeatedly transferring the temporarily stored data to the latches in the flash memory die during each of multiple write stages for each of the multiple word lines introduces delays associated with the data transfer, increasing latency of writing data to the MLC memory.

SUMMARY

Portions of data to be written to an MLC memory according to a multi-stage write operation are temporarily stored in a secondary memory between stages of the multi-stage write operation. By reading data from the MLC memory that is programmed during a prior stage of the multi-stage write operation to be used for subsequent stages of the multi-stage write operation, an amount of the data that is retrieved from the secondary memory for the subsequent stages is reduced after each stage of the multi-stage write operation. By reducing the amount of data that is temporarily stored between stages of the multi-stage write operation and that is later retrieved for subsequent stages, a size of the secondary memory, latency due to data transfer to and from the secondary memory, and/or latency due to storing data in the secondary memory may be reduced.

BRIEF DESCRIPTION OF THE DRAWINGS

FIG. 3 is a general diagram of tables depicting a particular embodiment of a three-stage direct write operation using partial data storage between write stages;

DETAILED DESCRIPTION

Figure 1:
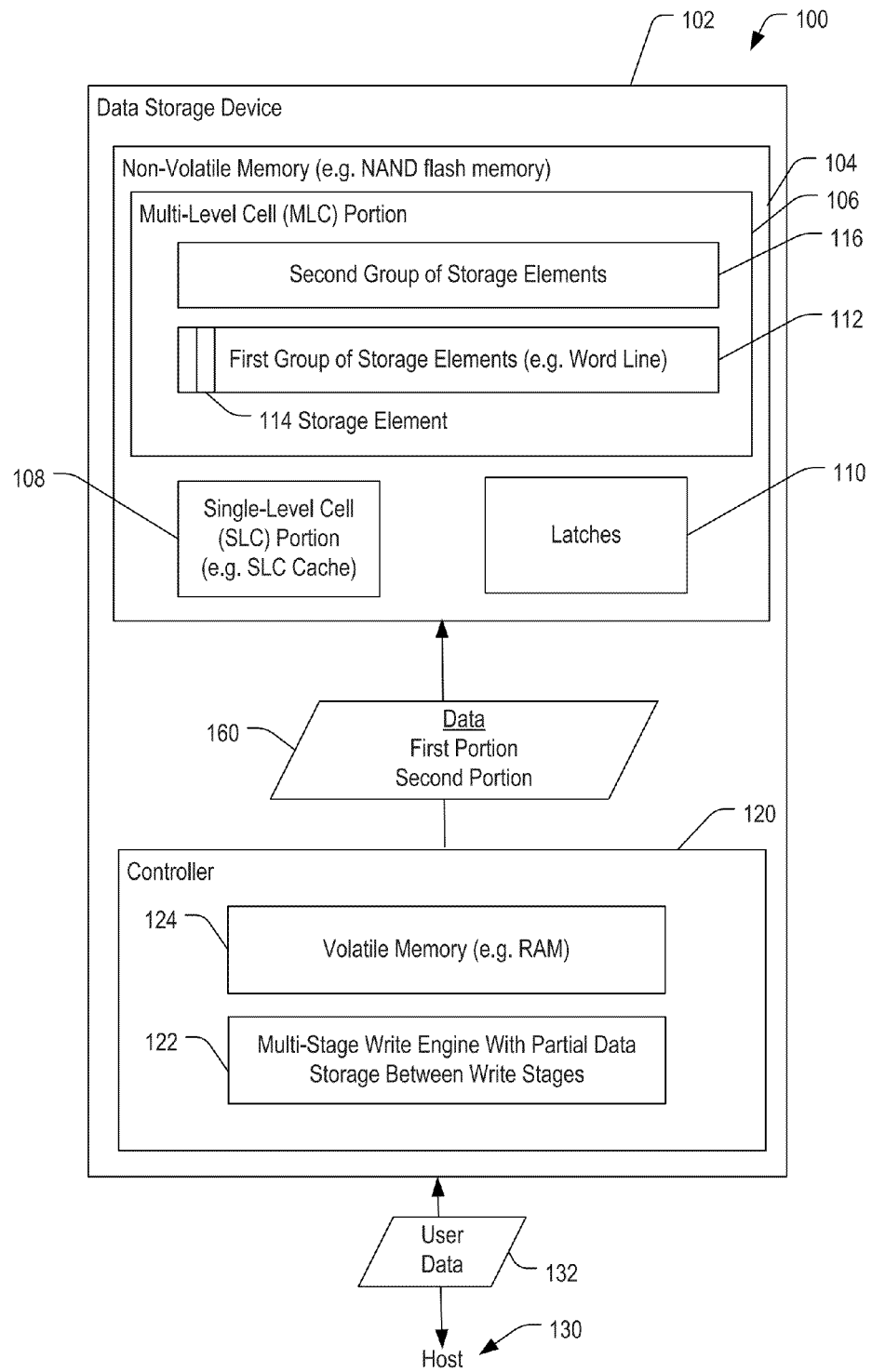
FIG. 1 is a block diagram of a particular illustrative embodiment of a system including a data storage device configured to perform a multi-stage direct write operation using partial data storage between write stages.

Referring to FIG. 1, a particular embodiment of a system 100 includes a data storage device 102 coupled to a host device 130. The data storage device 102 is configured to store data to a multi-level cell (MLC) portion 106 of a non-volatile memory 104 using partial data storage between stages of a multi-stage direct write operation.

The host device 130 may be configured to provide data, such as user data 132, to be stored at the non-volatile memory 104 or to request data to be read from the non-volatile memory 104. For example, the host device 130 may include a mobile telephone, a music or video player, a gaming console, an electronic book reader, a personal digital assistant (PDA), a computer, such as a laptop computer, a notebook computer, or a tablet, any other electronic device, or any combination thereof.

The data storage device 102 includes the non-volatile memory 104 coupled to a controller 120. For example, the non-volatile memory 104 may be a NAND flash memory. The non-volatile memory 104 includes latches 110, the MLC portion 106, such as a MLC partition, and a single level cell (SLC) portion 108, such as a SLC partition that may be used as a SLC cache.

The MLC portion 106 includes a representative first group 112 of storage elements, such as a word line of a multi-level cell (MLC) flash memory. The first group 112 includes a representative storage element 114, such as a flash MLC cell. The MLC portion 106 also includes a representative second group 116 of storage elements, such as another word line, adjacent to the first group 112.

The data storage device 102 may be a memory card, such as a Secure Digital SD® card, a microSD® card, a miniSD® card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples.

The latches 110 are configured to temporarily store data that is received from the controller 120 to be programmed to the SLC portion 108 and/or to the MLC portion 106. For example, in an implementation where the MLC portion 106 stores three bits of data in each storage element (e.g. three bits per cell (3BPC)), the latches 110 may be sized to contain at least three word lines of data to be stored as three logical pages in a single word line of the MLC portion 106. The latches 110 may also be configured to receive data read from the SLC portion 108 or from the MLC portion 106, such as data to be transferred to the controller 120 during a read operation.

The controller 120 is configured to receive data and instructions from and to send data to the host device 130 while the data storage device 102 is operatively coupled to the host device 130. The controller 120 is further configured to send data and commands to the non-volatile memory 104 and to receive data from the non-volatile memory 104. For example, the controller 120 is configured to send data and a write command to instruct the memory 104 to store the data to a specified address. As another example, the controller 120 is configured to send a read command to read data from a specified address of the non-volatile memory 104.

The controller 120 includes a volatile memory 124, such as a random access memory (RAM). The controller 120 also includes a multi-stage write engine 122 that is configured to enable direct programming of data, such as data 160, to the MLC portion 106 using partial data storage between write stages. For example, the multi-stage write engine 122 may control a write operation that includes sending the data 160 from the controller 120 to the latches 110 of the non-volatile memory 104. During a first write stage, first bits corresponding to a first portion of the data 160 (e.g. a first logical page) may be programmed from the latches 110 into the first group 112 of storage elements. Upon completion of the first write stage, each storage element of the first group 112 stores at least one bit of the first bits.

The multi-stage write engine 122 may be configured to alternate stages of programming data to the first group 112 with stages of programming data to the second group 116. For example, because fully programming data to the second group 116 may disturb fully programmed states of storage elements of the first group 112, multiple stages of partial programming of data to the first group 112 may be alternated with stages of partial programming of data to the second group 116, as described in further detail with respect to FIG. 2.

Upon completion of a programming stage storing first bits (corresponding to the first portion of the data 160) to the first group 112, data in the latches 110 corresponding to the first group 112 is temporarily stored to a second memory, such as the SLC portion 108 and/or the volatile memory 124, prior to overwriting the data in the latches 110 with data to be programmed to the second group 116. For example, second bits corresponding to a second portion of the data 160 are sent from the latches 110 to the second memory (the SLC portion 108 and/or the volatile memory 124). However, the first bits in the latches 110 (that have been programmed to the first group 112) are not sent to the second memory for storage. Instead, the first bits may be stored in the first group 112 in a manner that enables reliable reading of the first bits from the first group 112 during a subsequent write stage, as described in further detail with respect to FIG. 2.

The multi-stage write engine 122 is configured to re-load the first bits and the second bits into the latches 110 for a second write stage. To illustrate, the multi-stage write engine 122 may be configured to read the first bits from the first group 112, to retrieve the second bits from the second memory, and to load the first bits and the second bits into the latches 110. The multi-stage write engine 122 is configured to store at least the second bits from the latches 110 into the first group 112 during the second write stage. For example, in a 3BPC implementation, the data 160 may be written to the first group 112 using three write stages. The second bits (e.g. a second logical page) may be stored to the first group 112 during the second write stage and third bits (e.g. a third logical page) may be stored to the first group 112 during a third write stage. Alternatively, the second bits and the third bits (e.g. second and third logical pages) may be programmed to the first group 112 during the second write stage and re-programmed during a third write stage to compensate for disturbances resulting from an intervening write stage to the second group 116, as described in further detail with respect to FIG. 2.

During operation, the data 160 is sent from the controller 120 to the non-volatile memory 104 and is latched in the latches 110. First bits corresponding to a first portion of the data 160 are stored into the first group of storage elements 112 during a first write stage. Second bits corresponding to a second portion of the data 160 are sent to a second memory (e.g. the SLC portion 108 and/or the volatile memory 124) without sending the first bits to the second memory.

During a second write stage, the second bits are retrieved from the second memory and latched in the latches 110. In addition, the first bits are read from the first group 112 and latched in the latches 110. The second bits are then stored into the first group 112. In a 3BPC implementation, third bits may also be stored into the first group 112 during the second write stage or may be stored into the first group 112 during a third write stage.

By storing the second bits (but not the first bits) to the second memory after the first write stage, write latency is reduced as compared to systems where all bits corresponding to the data 160 are stored to a second memory at the end of the first write stage and later retrieved from the second memory for subsequent write stages.

In some conventional systems, all bits of all word lines being programmed in a multi-stage write operation are stored to temporary memory and all data for a particular word line is retrieved from the temporary memory for each write stage of the word line. However, adding additional controller RAM to have sufficient capacity to store all data of multiple word lines during a write operation may increase manufacturing costs of a data storage device. In addition, transferring all data for each word line for each write stage introduces additional latency that is affected by the bandwidth of a bus connecting the non-volatile memory to the controller. Using a SLC portion of a flash memory as a temporary memory for storing all data for multiple WLs being programmed requires a larger SLC cache than may otherwise be implemented in systems that use controller RAM as temporary memory. In addition, temporary storage of WLs of data in the SLC cache includes performing additional programming of the SLC portion of the flash memory and increases wear of the SLC cache.

In contrast to conventional systems that store in temporary memory all data of all word lines being programmed, the data storage device 102 uses a reduced amount of temporary memory for storing word line data for word lines in the process of being programmed to the MLC portion 106. Reduction of temporary memory used for storing word line data may be accomplished by reading data from the MLC portion 106 that was programmed during the first write stage of each word line (e.g. the first group 112) to the internal latches 110 in preparation for programming of a second write stage for the word line. Reading data from the MLC portion 106 (that was programmed during the first write stage) reduces an amount of data that has to be retrieved from secondary memory for the second write stage. In addition, data written to the MLC portion 106 during the second write stage may be read from the MLC portion 106 to the internal latches 110 in preparation for a final stage of programming of the word line.

In some embodiments, a mixture of different types of temporary memory may be used. For example, the volatile memory 124 in the controller 120 (e.g. controller RAM), the internal latches 110, and the SLC portion 108 may be used to achieve a reduction in a total amount of additional memory to store data to accommodate a three-phase programming process. In addition, using a mixture of types of temporary memory may enable improved performance of programming data within the system 100, as described in further detail with respect to FIGS. 2-5.

Figure 2:
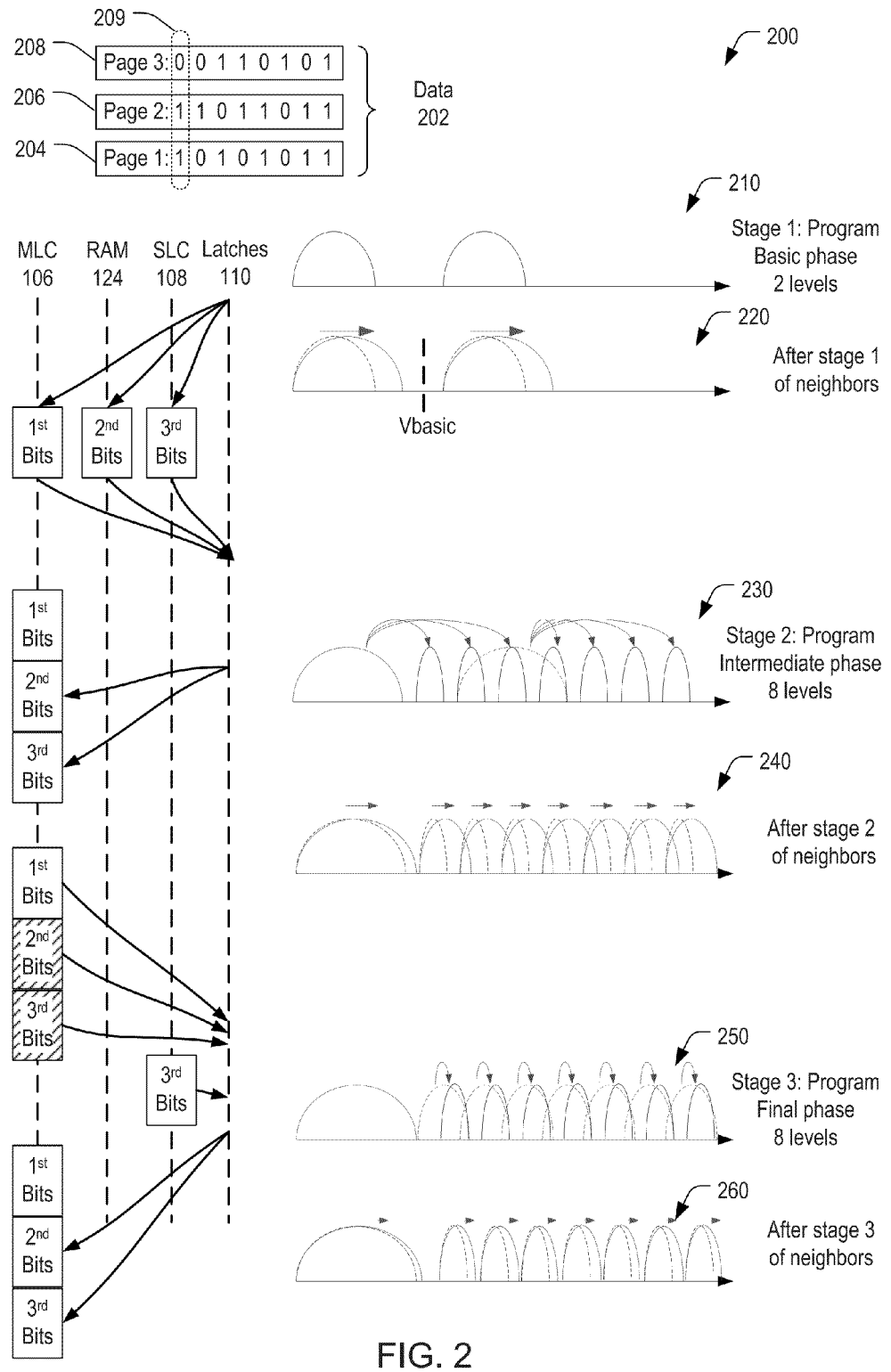
FIG. 2 is a general diagram illustrating a particular embodiment of a multi-stage direct write operation using partial data storage between write stages.

FIG. 2 illustrates an example 200 of a multi-stage write operation, also referred to as "multi-pass programming" or "out of sequence" programming, that may be used to write first data to a first group of storage elements (e.g. a first word line) and to write second data to a second group of storage elements (e.g. a second word line adjacent to the first word line). A first pass (e.g. a first write stage) may write a portion of the first data to the first group of storage elements, followed by writing a portion of the second data to the second group of storage elements. After the first pass, coupling effects on the first group of storage elements due to writing to the second group of storage elements during the first pass may result in a shifting of threshold voltages of the first group of storage elements. The shifted threshold voltages are used as starting threshold values when performing a second pass to finish writing the first data to the first group of storage elements. Similarly, coupling effects on the second group of storage elements due to writing to the first group of storage elements during the second pass may be accommodated when performing a second pass (e.g. a second write stage) to finish writing the second data to the second group of storage elements.

In the example 200 depicted in FIG. 2, data 202 is programmed into the MLC portion 106 of FIG. 1 in three phases: Basic (B), Intermediate (I), and Final (F) (e.g. a three-stage write operation). During the Basic phase, a rough approximation of the desired state of each cell is programmed in a word line (WL) or other group of cells (e.g. the first group 112). Only a subset of the cell states (i.e. some but not all available states of the storage elements) are programmed during the Basic phase. For example, the Basic phase may program only two basic states, such that any data associated with the lower half of the states (e.g. states corresponding to lower threshold voltages) is programmed into the lower Basic state and any data that is associated with the upper half of the states (e.g. states corresponding to higher threshold voltages) are programmed into the upper Basic state. For example, the Basic phase may be equivalent to programming only the most significant bit (MSB) of data into each storage element, such as a bit corresponding to a first page 204 of multiple logical pages 204, 206, and 208 of the data 202.

The Intermediate phase is applied to a WL after adjacent WLs, such as the second group 116 of FIG. 1, have been programmed (e.g. one adjacent WL may be programmed into Basic phase and another adjacent WL may be programmed into Final phase) and the programming of adjacent WLs has induced cross coupling effects into the WL to be programmed from Basic phase to Intermediate phase. The Intermediate phase programming may program all the states of the cells, e.g. the first, second, and third pages 204, 206, and 208, respectively, but the states of a first group of cells may overlap after a second group of adjacent cells have been programmed. Therefore the result of the Intermediate phase may not be accurate enough, and the Final phase may be used to program the WL to enable reliable retrieval of stored data (e.g. with little or no overlapping between states).

A first cell voltage distribution (CVD) 210 of the WL (e.g. the first group 112 of FIG. 1) illustrates a Basic programming phase where only two voltage regions are programmed, where the left-most region (i.e. lowest voltage state) is an Erase region. This Basic programming stores only the MSB (e.g. the first page 204) of a binary mapping of the data 202 (binary mapping is described in further detail with respect to FIG. 4). For example, the data 202 including the first page 204, the second page 206, and the third page 208 may be transferred from the controller 120 of FIG. 1 to the latches 110, the data 202 may be transformed within the latches 110 from a Grey mapping to a binary mapping, and the MSB of the bits corresponding to the binary mapping may be programmed into the MLC portion 106 from the latches 110.

After Basic programming, the first bits are programmed in the MLC portion 106 of FIG. 1. Second bits corresponding to the data 202 (e.g. bits corresponding to the second page 206 of the binary mapping of the data 202) are transferred from the latches 110 to the volatile memory 124 ("RAM 124"). Third bits corresponding to the data 202 (e.g. bits corresponding to the third page 208 of the binary mapping of the data 202) are written to the SLC portion 108 ("SLC 108"). After storing the second and third bits to the RAM 124 and the SLC 108, respectively, data corresponding to a neighboring WL (e.g. a WL that exhibits cross-coupling effects with the WL being programmed, such as an adjacent WL), such as the second group 116 of FIG. 1, may be loaded into the latches 110 (e.g. in response to data read and/or data transfer commands issued by the multi-stage write engine 122 of FIG. 1).

A second CVD 220 depicts an influence of cross-talk resulting from programming data to one or more neighboring WLs that causes the voltage regions of the first CVD 210 to expand. After a write stage is performed to one or more neighboring WLs, bits corresponding to the WL are re-loaded into the latches 110. For example, the first bits are read from the MLC 106 using a read voltage Vbasic located between the non-overlapping states of the second CVD 220. The second bits are transferred from the RAM 124 to the latches 110, and the third bits are read from the SLC 108 to the latches 110.

Intermediate programming of the WL using the first, second, and third bits in the latches 110 results in a third CVD 230. The third CVD 230 has eight distinct voltage regions. Each voltage region corresponds to a three-bit value stored in a MLC cell (i.e. a three-bit value 209 having a MSB from the first page 204, a middle bit from the middle page 206, and a LSB from the third page 208). Arrows accompanying the third CVD 230 illustrate that the Erase state diverges into the first four lower states (including the original Erase state) and that the other state of the second CVD 220 is split into the four upper states. Upon completion of Intermediate programming of the WL, the first bits, the second bits, and the third bits are stored in the MLC 106 (i.e. programmed to the WL). A copy of the second bits may remain in the RAM 124. A copy of the third bits remains programmed in the SLC 108. After Intermediate stage programming to the WL, data corresponding to a neighboring WL (e.g. the second group 116 of FIG. 1) may be loaded into the latches 110.

A fourth CVD 240 shows the effect of the programming of one or more neighboring WLs. Each of the states of the third CVD 230 has expanded, causing overlapping between the states. As a result of the overlapping, the data that was stored during the Intermediate phase programming may not be reliably read from the WL in the MLC 106 (illustrated as diagonal lines in boxes representing the second bits and the third bits in the MLC 106).

Final phase programming may be initiated by reading the first, second, and third bits (possibly with errors due to overlapping of states) from the MLC 106 into the latches 110. The third bits are also read from the SLC 108 into the latches 110. As described in further detail with respect to FIG. 5, the third bits from the SLC 108 can be used to determine the originally programmed states of the WL (i.e. states of the third CVD 230 prior to the overlapping of states illustrated in the fourth CVD 240).

A fifth CVD 250 illustrates states of storage elements of the WL after the Final phase programming. A sixth CVD 260 illustrates states of storage elements of the WL after programming of one or more neighboring WLs. As illustrated in the sixth CVD 260, the states are non-overlapping and can therefore be reliably read from the MLC 106.

Programming data to a flash memory may include transferring the data from the controller (e.g. the controller RAM) into the data latches of the corresponding memory die (in a multi-die memory system) and a corresponding plane of the memory die. A speed of transferring data may be limited by the width of the bus connecting the controller to the one or more memory dies.

After transferring the data into the latches, the flash memory may be programmed using the data in the latches. Programming data to the flash memory typically takes more time than transferring data from the controller to the latches. However, programming data to the flash memory can be parallelized when performed separately in multiple memory dies. Therefore, in a multi-plane, multi-die environment, data write latency may be reduced by replacing one or more transfer operations with programming operations.

Reading from the flash memory includes sensing the flash memory via a sensing operation that reads data from a flash memory WL into the latches (e.g. one logical page per latch). Sensing of a single logical page is typically the fastest of the three operations (transferring, programming, and sensing) and sensing can be parallelized when performed sequentially in multiple memory dies and/or planes. After sensing from memory, data may be transferred from the latches to the controller.

Transferring to (from) the latches from (to) the RAM and programming the flash may be performed concurrently, when applied to different WLs. For example, transferring of data corresponding to WL(1) can be done concurrently with programming of data to WL(0). Similarly, transferring and sensing may be performed concurrently.

In examples provided in Table 1 and FIG. 3, sensing and programming in the same plane are not performed concurrently. However, in other embodiments, sensing and programming may be performed concurrently and the provided examples may be modified accordingly.

Further, in the examples provided in Table 1 and FIG. 2, relatively few internal latches are used inside the flash circuitry. For example, at most three pages of data are concurrently latched in the flash circuitry during the multi-stage write operation illustrated in FIG. 2. Latches may be relatively expensive and therefore a multi-stage write operation may be implemented that reduces a number of latches required to be implemented in the flash circuitry.

Implementing a three-phase programming scheme at a flash memory device may include concurrent temporary storage of three WLs of data. For example, at (discrete) time t, three different WLs of an MLC portion of a memory, such as the MLC portion 106 of FIG. 1, may be in different phases of programming. A first word line WL(n) may be about to be programmed into a Final state, a second word line WL(n+1) may be about to be programmed into an Intermediate state, and a third word line WL(n+2) may be about to be programmed into a Basic state.

Table 1 shows an example data flow for alternating stages of programming three WLs. Three word lines WL(n) for n=0 . . . 2 are operated on during discrete times t for t=0 . . . 9.

TABLE 1

| Three-phase programming of three WLs (0, 1, and 2) | | | | | | | | | | |
|---|---|---|---|---|---|---|---|---|---|---|
| Time (t) | 0 | 1 | 2 | 3 | 4 | 5 | 6 | 7 | 8 | 9 |
| WL transferred to latches | 0 | 1 | 0 | 2 | 1 | 0 | 3 | 2 | 1 | 4 |
| Programming Phase | | B(0) | B(1) | I(0) | B(2) | I(1) | F(0) | B(3) | I(2) | F(1) |

At time t=0 a first WL of data (WL(0)) is transferred from a flash memory controller into a set of latches inside a flash array to be programmed into the flash memory (at t=1) using the Basic phase. No actual programming of the flash memory is performed at t=0, so the last row of the first column of Table 1 is blank.

At time t=1 WL(0) is programmed into the memory during a basic phase programming, indicated as B(0) in the last row of column 1 Also at time t=1, the second WL of data (WL(1)) is transferred from the controller into the set of the internal latches to be programmed using the basic phase at time t=2. The first row of the second column of Table 1 therefore has an entry "1".

Transferring of data for one WL into a set of latches may be performed in parallel with programming data of a different WL from the same set of latches into the flash memory. As a result, a programming latency may be reduced due to pipelining of operations. Transferring data from the controller to the latches while programming the flash memory from the latches may be referred to as cache programming. Transferring data to the latches overwrites the previous content of the latches, so the programming is performed prior to the transferring. However, the time scale for programming and transferring may be contained within one discrete time step of the three-phase programming scheme. Therefore it is described above that the two operations of programming and transferring are performed in parallel.

At time t=2, data for WL(0) is transferred again from the controller into the internal latches in preparation for intermediate phase programming to be performed at time t=3. In addition, during time t=2, a basic phase programming operation is performed for the data of WL(1) stored in a set of internal latches. The basic phase programming for WL(1) is indicated as B(1). Data transfer from the memory controller to the flash latches and concurrent programming of other data from the flash latches to the flash memory continues as illustrated in Table 1 for subsequent times t=3, t=4, and t=5.

At time t=6, final phase programming of WL(0) is performed using data from a set of latches of the flash memory. Also at time t=6, a fourth word line of data (WL(3)) is transferred from the memory controller to a set of latches in preparation for basic phase programming of a fourth WL, WL(3). At this stage (i.e. t=6), the data of WL(0) may be discarded from temporary memory because WL(0) has been stored in the flash memory upon completion of all three stages (basic, intermediate, and final). For example, the data for WL(0) may be discarded after the data is transferred into the internal flash latches for programming the final phase (F(0)). Therefore, temporary memory (e.g. volatile or non-volatile memory) may store data corresponding to three WLs at a given time. For example, data corresponding to WL(0), WL(1), WL(2) is initially stored in temporary memory. After transferring data of WL(0) to the internal latches in preparation for final phase programming of WL(0) (e.g. F(0)), data of WL(0) may be discarded from temporary memory as data of WL(3) is read into the internal latches.

In a steady state operation of the example illustrated in Table 1, a programming sequence is performed according to B, I, F, B, I, F, B, I, F . . . and the corresponding word line sequence is N+2, N+1, N, N+3, N+2, N+1, N+4, N+3, N+2 . . . .

According to a particular embodiment, at each time t, a number of word lines N (N is a predefined integer, such as 3 in the example of Table 1) may be in the process of being programmed to the flash memory. Each of the N word lines may be in a different phase of programming FIG. 3 depicts a particular example 300, where N=3, in a steady state of programming with a 3-clock cycle programming series being performed. Because the programming cycle has a period of three, time units associated with sequential phases of programming in the example 300 are referred to as 3t, 3t+1, 3t+2. A following programming cycle would be referred to as 3(t+1), 3(t+1)+1, 3(t+1)+2.

A first table 310 illustrates a status and an action corresponding to various adjacent word lines (WL(n−1) . . . WL(n+2)) at time 3t. A first group of data bits to be programmed into a word line of the non-volatile memory may be received from an external host. The first group of data bits is transferred into internal latches of the non-volatile memory in preparation for basic phase programming of WL(n+2). Concurrently, data associated with two previous word lines, WL(n+1) and WL(n), is stored as temporary data partly in the flash memory die, e.g. in the MLC portion 106 of FIG. 1, and partly in auxiliary volatile memory, e.g. in the volatile memory 124 of FIG. 1. For example, data associated with WL(n+1) is partly stored in the MLC memory as basic phase program data and other parts of the data associated with WL(n+1) are stored in auxiliary volatile memory. Data associated with WL(n) is partly stored in the MLC as intermediate phase program data and other parts of the data associated with WL(n) are stored in auxiliary volatile memory.

In parallel with the data of WL(n+2) being stored to the internal latches, data of WL(n−1) is programmed to the flash MLC memory during a final phase. All the data required for programming WL(n−1) may have already been transferred into the flash internal latches during a previous time period so that no data related to WL(n−1) is stored in the controller RAM.

Referring to the second table 320 of FIG. 3, at time 3t+1, a basic phase of WL(n+2) programs a portion of the data associated with WL(n+2) into the flash MLC memory. Basic phase programming stores the portion of the data associated with WL(n+2) reliably, such as the most significant bit of the data to be stored in each memory cell of WL(n+2) in MLC memory. However, other portions of the data associated with WL(n+2) are not reliably programmed to the MLC. Therefore, the other portions of the data WL(n+2) are written into an external volatile memory, such as a RAM in the controller. The data of WL(n+2) that is temporarily stored at the non-volatile memory and a mapping of bits to states corresponding to the data of WL(n+2) may be different from the data and mapping of WL(n+2) initially provided to the internal flash latches for programming of the basic phase, such as described with respect to FIG. 4. As a result, data that is written into the controller RAM may include new bits that are computed as a function of the original data of WL(n+2). The new bits may be fewer in number than the bits of the original data of WL(n+2).

For example, a word line may include three logical pages of data, where each page contains one bit from each cell of the word line in the MLC memory. The basic phase programming may store a single bit of the data for each cell (e.g. the most significant bit (MSB)) into the MLC portion of the flash memory and two bits of data (which may or may not duplicate the non-programmed two bits of the data) may be stored in a controller RAM. (Alternatively, as depicted in FIG. 2, the two bits of data may be stored partly in the RAM 124 and partly on the SLC 108).

Also during discrete time 3t+1, WL(n+1) is reconstructed by reading the Basic phase programming of WL(n+1) from the MLC memory together with additional data stored in the controller RAM. The MSB can be reliably read by applying a read voltage between the two voltage regions associated with the Basic phase programming, such as illustrated in the second CVD 220 of FIG. 2. The data that is stored in the controller RAM and used for the reconstruction is transferred to the internal latches in parallel with the programming of WL(n+2), and in parallel with reading of the Basic phase programming of WL(n+1) from the MLC memory. The reconstruction of WL(n+1) will preferably be performed within the non-volatile memory in order to prevent a transfer of the Basic phase programmed WL(n+1) from the non-volatile memory to the controller, and then back again from the controller to the non-volatile memory. The reconstructed WL(n+1) is stored in the internal latches of the non-volatile memory and overwrites the previous contents of the internal latches.

A third table 330 corresponds to time 3t+2. At this time the non-volatile memory is programmed from the internal latches, resulting in an Intermediate phase programming of the contents of WL(n+1). The Intermediate phase programming may store all the bits of WL(n+1) in the flash but the bits may not be reliably stored and overlaps between adjacent states may occur. Therefore, a third portion of the data (e.g. the LSB) is written into an external volatile memory, such as a RAM in the controller (note the LSB may have been previously stored in the RAM during the Basic phase programming of WL(n+1) and may not need to be re-stored to the RAM). The LSB can help in reliably decoding the Intermediate phase programming, as described with respect to FIG. 5. After the Intermediate phase is complete the MLC memory stores (unreliably) all 3 bits of the data for each storage element, and the RAM stores the LSB as an additional parity bit for reliably decoding the data.

Also, during time 3t+2, WL(n) is reconstructed by reading the Intermediate phase programming of WL(n) from the MLC memory and additional bits that are stored in the controller RAM. The additional bits in the controller RAM are transferred to the internal latches in parallel with the programming of WL(n+1) and in parallel with reading of the Intermediate phase programming of WL(n) from the MLC memory. The reconstructed WL(n) is stored in the internal latches of the non-volatile memory and overwrites the previous contents of the internal latches. Once WL(n) is reconstructed in the internal latches and ready to be programmed into Final phase, its contents may be discarded from the temporary storage devices, e.g. the additional volatile RAM, leaving space for reading new data from the host.

During time 3(t+1) (not shown in FIG. 3), a next cycle may begin by reading WL(n+3) from the host. In parallel, WL(n) is programmed to its Final phase from the data stored in the internal latches of the flash. After time 3(t+1), a next programming cycle may begin at time 3(t+1)+1.

In a variant of the embodiment of FIG. 3, the WL data that is received at the internal latches from the controller is determined according to a Grey representation. A binary representation of the LSB may be computed inside the non-volatile memory by performing an exclusive OR operation (XORing) of the pages of WL data having the Grey representation. The binary representation of the LSB may be stored inside the non-volatile memory, such as the third bits stored to the SLC 124 in FIG. 2. As a result, transfer of the LSB from the non-volatile memory to the controller after computing the binary representation of the LSB inside the non-volatile memory may be avoided.

Transfer of the LSB from the controller RAM to the flash may also be avoided when preparing for Intermediate phase programming and Final phase programming. The LSB may be sensed from the SLC directly into the internal latches. As a result, three transfer operations may be avoided as compared to storing LSB data in the controller RAM. Moreover, transfer operations between a memory die and the controller may be subject to a bandwidth of the bus connecting the controller to the memory die, while sensing internally to the non-volatile memory die(s) can be performed in parallel in multiple dies. An improvement in programming time may increase with an increase of the number of dies connected in parallel to the same controller.

Figure 4:
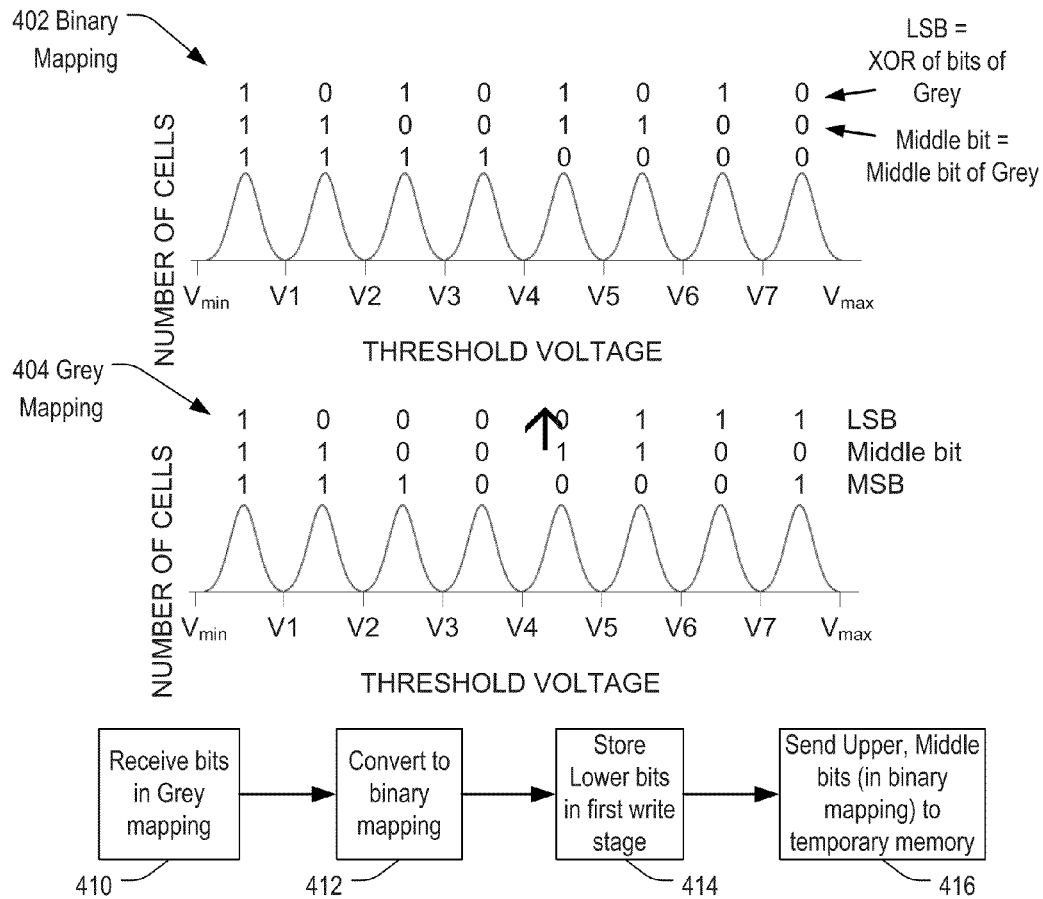
FIG. 4 is a general diagram of a particular embodiment of converting bits from a Grey mapping to a binary mapping during a direct write operation that uses partial data storage between write stages.

FIG. 4 illustrates a binary mapping 402 and a Grey mapping 404 of bit values to states of a MLC storage element. The binary mapping 402 maps the states in a "natural" ordering. For example, the lowest state may be represented by the binary expansion of 0 (e.g. L bits of 0 values in an L bit-per-cell system) and the highest state may be represented by the binary expansion of $2^L-1$, which is L bits of 1 values.

The binary mapping 402 illustrates a slight variation that may occur in flash systems where the role of 0 and 1 is reversed, thus 0 is represented by an all 1-s vector of length L, 1 is represented by $$\underbrace{11\ldots10}_{L},$$

and $2^L-1$ is represented by an all 0-s vector of length L.

The Grey mapping 404 is a different type of mapping where two adjacent states differ by only one bit value. This reduces the overall number of bit errors resulting from an incorrect identification of states of a storage element because the most likely error to occur arises from an adjacent state being read at a storage element instead of an originally programmed state. When a Grey mapping is used, such a missread will result in a single bit error.

However, while programming a MLC flash memory from data stored in internal data latches, the binary mapping 402 creates a more "natural" association between the content of the latch and the corresponding threshold voltage than the Grey mapping 404. To illustrate, the particular voltage region to which a storage element is to be programmed can be determined by adding 1 to the binary representation of the data to be stored in the storage element. For example, a cell whose data content is 000 (according to the Grey mapping 404) is to be programmed to the fourth voltage region from a lowest threshold voltage Vmin. In the binary mapping 402, the representation of the fourth voltage region is 100, which is the binary expansion of 3 (after interchanging 0 and 1 according to a flash memory implementation).

When sensing the MLC flash, the sense results may be either binary or Grey according to the reading voltages applied to read the flash memory. In some embodiments, the Basic phase programming enables recovery of the MSB of the binary mapping from the MLC flash. Recovery of the MSB can be performed by reading with one reading voltage at the middle of the voltage range of the Basic phase, as illustrated in FIG. 2.

After transferring Grey mapping data from the controller to the flash latches, the data may be converted to binary mapping. When transferring binary mapping data from the flash latches to the controller during a data read operation, the binary mapping data may be converted to Grey mapping prior to transfer to the controller.

In some implementations, converting from Grey mapping to binary mapping may be performed via a lookup table. However, a general relationship that is true for any Grey mapping is that the XOR of all the pages of a Grey mapping is either the LSB of the binary mapping or the logical complement of the LSB of the binary mapping. Because adjacent Grey mapping states differ by exactly 1 bit, the XOR of all the pages (bits) of a Grey mapping generates a 1010 . . . 10 pattern, (or 0101 . . . 01), matching the pattern of the LSB of the binary mapping 402 (or its logical complement). Another relationship for the Grey mapping 404 is that the middle page of the Grey mapping 404 is equal to the middle page of the binary mapping 402.

When transferring data from the controller to the flash latches, where in the controller the data is in the Grey mapping 404 format and is converted to the binary format 402 in the latches, the MSB of the binary mapping 402 may be retrieved via a lookup table, but the middle page and the upper page of the binary mapping 402 (storing the middle bit and the LSB) may be easily computed.

Bits in a Grey mapping may be received in the internal flash latches from a controller, at 410. The bits may be converted to a binary mapping within the latches, at 412. For example, the bits may be received in the Grey mapping 404 and converted to the binary mapping 402. The MSB of the binary mapping 402 may be determined via a lookup table or dedicated logic circuitry. The middle bit of the binary mapping 402 is the same as the Grey mapping 404, and the LSB of the binary mapping 402 may be computed as the XOR of the bits of the Grey mapping 404.

The lower bits (MSBs) are stored in the MLC in a first write stage, at 414. For example, a MSB of 1 in the binary mapping 402 corresponds to the Erase state and a MSB of 0 corresponds to the higher-voltage state illustrated in the first CVD 210 of FIG. 2. The upper and middle bits (LSBs and middle bits, respectively) are sent to temporary memory (e.g. the SLC portion 108 and/or the volatile memory 224 of FIG. 1) in the binary mapping 402 without being converted back to the Grey mapping 404, at 416.

Conventional reading of a flash memory is performed by applying reading voltages at the mid-points between voltage regions associated with the states of the flash calls. For example, in FIG. 4, the voltages V1-V7 correspond to reading voltages between states. Applying the reading voltages at mid-points between voltage regions enables distinguishing between the programmed states and enables reliable decoding of the data stored in the flash.

However, as illustrated in the fourth CVD 240 of FIG. 2, after Intermediate phase programming the voltage regions of adjacent states may overlap. Therefore, reading with reading voltages at mid-points between voltage regions does not distinguish between adjacent states.

Figure 5:
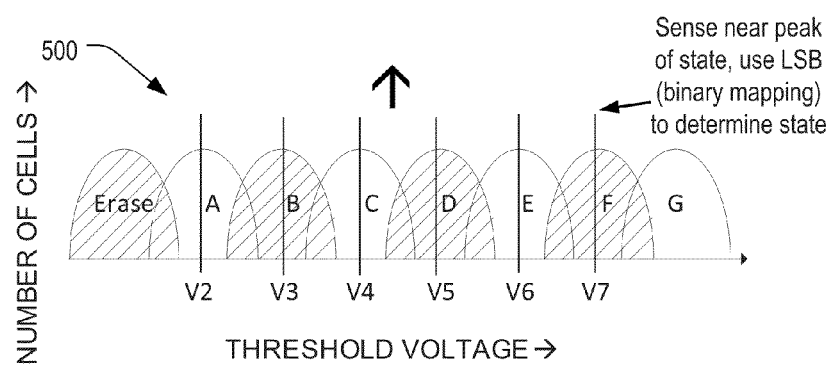
FIG. 5 is a general diagram of a particular embodiment of resolving overlapping cell states after a second stage of a direct write operation.

FIG. 5 illustrates an example of a CVD 500 where reconstruction of the data from the Intermediate phase programming is enabled by applying reading voltages at or near peak points of the voltage distribution and using the LSB that may be read from secondary memory. Voltage regions associated with an LSB of "1" are filled with diagonal lines. If the LSB is "1", then a threshold voltage which is less than V2 is associated with the Erase state, a threshold voltage which is between V2 and V4 is associated with state B, a threshold voltage which is between V4 and V6 is associated with state D, and a threshold voltage which is higher than V6 is associated with state F. If the LSB is 0, then a threshold voltage which is less than V3 is associated with state A, a threshold voltage which is between V3 and V5 is associated with state C, a threshold voltage which is between V5 and V7 is associated with state E, and a threshold voltage which is higher than V7 is associated with state G.

Figure 6:
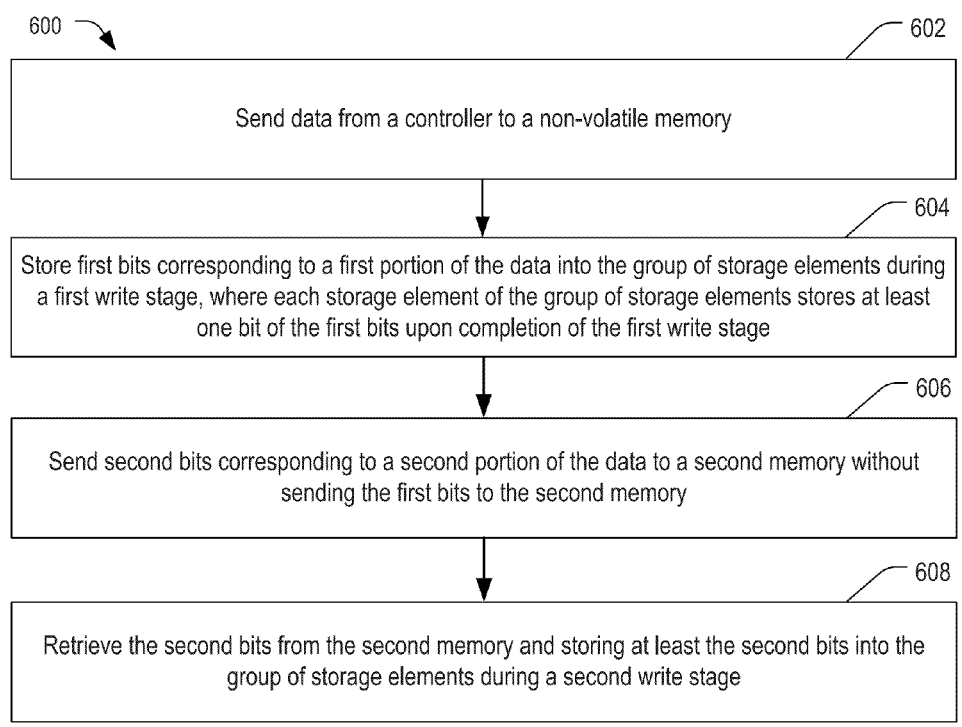
FIG. 6 is a flow chart of a particular illustrative embodiment of a method of direct multi-cell programming using partial data storage between write stages.

Referring to FIG. 6, a particular embodiment of a method 600 is depicted. The method 600 may be performed in a data storage device that includes a controller coupled to a non-volatile memory, where the non-volatile memory includes a group of storage elements and each storage element is configured to store multiple data bits. For example, the method 600 may be performed in the data storage device 102 of FIG. 1.

Data is sent from the controller to the non-volatile memory, at 602. For example, the data 160 of FIG. 1 may be sent from the controller 120 to the latches 110 to be stored in the first group 112 in the MLC portion 106.

First bits corresponding to a first portion of the data are stored into the group of storage elements during a first write stage, at 604. Each storage element of the group of storage elements stores at least one bit of the first bits upon completion of the first write stage. For example, as described with respect to the first CVD 210 of FIG. 2, the first write stage may store a bit from the first page 204 into each storage element of the group of storage elements in the MLC 106.

Second bits corresponding to a second portion of the data are sent to a second memory without sending the first bits to the second memory, at 606. For example, the second bits illustrated in FIG. 2 are sent to the RAM 124 after Basic phase programming. The first bits are reliably stored in the MLC 106 and are not sent to the RAM 124 with the second bits.

The second bits are retrieved from the second memory and at least the second bits are stored into the group of storage elements during a second write stage, at 608. For example, the second bits illustrated in FIG. 2 are retrieved from the RAM 124 to the latches 110. The first bits of FIG. 2 are read from the MLC 106 to the latches 110. The second bits may be programmed to the MLC 106 during the Intermediate phase programming illustrated in FIG. 2.

The method 600 may be implemented using a 2 bits-per-cell (2BPC) MLC memory where the first bits correspond to a first logical page and the second bits correspond to a second logical page. As another example, the method 600 may be implemented using a 3BPC, 4BPC, or any other number of bits-per-cell MLC memory.

For example, the data may include multiple logical pages. The first portion of the data may correspond to a first logical page and the second portion of the data may correspond to a second logical page, such as the first page 204 and the second page 206 of the data 202 of FIG. 2. In a 3BPC implementation, a third portion of the data may correspond to a third logical page, such as the third page 208 of FIG. 2. Third bits corresponding to the third logical page may be retrievable from a third memory (e.g. the SLC 108 of FIG. 2) following completion of the first write stage.

The second write stage may store information corresponding to the second bits and corresponding to the third bits, such as illustrated in the third CVD 230 of FIG. 2. Each storage element of the group of storage elements may store three bits upon completion of the second write stage. The second write stage may store the second bits and the third bits into the group of storage elements by programming each storage element of the group of storage elements to a corresponding particular state of a set of states, such as illustrated in the third CVD 230 of FIG. 2.

After completion of the second write stage and after completion of another write stage to another group of cells (e.g. resulting in the fourth CVD 240 of FIG. 2), the third bits may be retrieved from the third memory and a third write stage may be performed to program each storage element to the corresponding particular state, such as the Final phase programming described with respect to FIG. 2 that results in the fifth CVD 250.

In implementations storing more than two bits per storage element, after storing the first bits into the group of storage elements, third bits corresponding to a third portion of the data (e.g. the third bits corresponding to the third logical page 208 of FIG. 2) may be sent to a third memory without sending the first bits to the third memory. For example, in some implementations the second memory may be within the controller (e.g. the RAM 124 of FIG. 2) and the third memory may include a single level cell (SLC) portion of the non-volatile memory (e.g. the SLC 108 of FIG. 2). Alternatively, the second memory and the third memory may be within the controller (e.g. the second bits and the third bits may be sent to the RAM 124). As another option, the second memory and the third memory may include a single level cell (SLC) portion of the non-volatile memory (e.g. the second bit and the third bits may be stored in the SLC 108 of FIG. 2).

In some implementations, the data may be converted from a grey-type encoding to a binary-type encoding prior to sending the second bits to the second memory, and the second bits are encoded according to the binary-type encoding. For example, as described with respect to FIG. 4, the data may be converted from the Grey mapping 404 to the binary mapping 402 in the latches 110 of FIG. 1. After storing the first bits (e.g. a lower page of data) to the group of storage elements, the remaining bits (e.g. a middle page of bits and an upper page of bits) may be sent to secondary memory without conversion of the bits back to the Grey mapping 404.

By sending the second bits to a second memory after the first write stage without sending the first bits to the second memory, an additional latency that would result from sending the first bits to the second memory (e.g. a latency due to transfer of the first bits to the controller 120 of FIG. 1 or a latency due to programming the first bits to the SLC portion 108 of FIG. 1) is avoided. In addition, by not sending the first bits to a second memory after the first write stage, an amount of controller RAM and/or a size of an SLC cache may be reduced as compared to implementations where all bits are stored in secondary memory between write stages.

Although various components depicted herein are illustrated as block components and described in general terms, such components may include one or more microprocessors, state machines, or other circuits configured to enable the multi-stage write engine 122 of FIG. 1 to store data to the MLC portion 106 using partial data storage between write stages. For example, the multi-stage write engine 122 may represent physical components, such as hardware controllers, state machines, logic circuits, or other structures, to enable the multi-stage write engine 122 of FIG. 1 to initiate a first write stage to write data to the first group 112 and to send some but not all of the data to secondary memory between write stages while another write stage is performed at the second group 116.

The multi-stage write engine 122 may be implemented using a microprocessor or microcontroller programmed to send the data 160 to the latches 110, initiate a first write stage to store first bits to the first group 112, send second bits to the SLC portion 108 or to the volatile memory 124 to free the latches 110 for other data corresponding to the second group 116, and re-load the latches 110 with the second bits from the second memory and the first bits read from the first group 112. In a particular embodiment, the multi-stage write engine 122 includes a processor executing instructions that are stored at the non-volatile memory 104. Alternatively, or in addition, executable instructions that are executed by the processor may be stored at a separate memory location that is not part of the non-volatile memory 104, such as at a read-only memory (ROM).

In a particular embodiment, the data storage device 102 may be implemented in a portable device configured to be selectively coupled to one or more external devices. However, in other embodiments, the data storage device 102 may be attached or embedded within one or more host devices, such as within a housing of a host communication device. For example, the data storage device 102 may be within a packaged apparatus such as a wireless telephone, a personal digital assistant (PDA), a gaming device or console, a portable navigation device, or other device that uses internal non-volatile memory. In a particular embodiment, the data storage device 102 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data storage device comprising:
a non-volatile memory including a group of storage elements;
a set of latches configured to store data to be programmed to the group of storage elements during each particular stage of a multi-stage write operation; and
a second memory configured to store bits corresponding to one or more portions of the data during a time period between stages of the multi-stage write operation,
wherein the second memory is configured to receive the bits corresponding to the one or more portions of the data from the latches without receiving bits corresponding to a first portion of the data that is programmed to the group of storage elements during a first stage of the multi-stage write operation, and
wherein the latches are configured to receive the bits corresponding to the one or more portions of the data from the second memory and to receive the bits corresponding to the first portion of the data from the group of storage elements during a subsequent stage of the multi-stage write operation.

2. The data storage device of claim 1, further comprising mapping circuitry coupled to the latches, wherein the mapping circuitry is configured to modify the data in the latches prior to the first stage, from a grey-type encoding to a binary-type encoding.

3. The data storage device of claim 2, wherein the mapping circuitry includes an exclusive-OR circuit to generate at least one value of the binary-type encoding of the data based on values of the grey-type encoding of the data.

4. The data storage device of claim 2, wherein the mapping circuitry is configured to perform a table lookup operation to determine at least one value of the binary-type encoding of the data based on values of the grey-type encoding of the data.

5. The data storage device of claim 1, wherein the second memory includes a single level cell (SLC) cache.

6. The data storage device of claim 1, further comprising a controller, the controller configured to send the data to the non-volatile memory to be stored at the group of storage elements.

7. The data storage device of claim 6, further comprising a third memory configured to store one or more portions of the data.

8. The data storage device of claim 7, wherein the third memory includes a single level cell (SLC) cache.

9. The data storage device of claim 7, wherein the third memory is within the controller.

10. The data storage device of claim 7, wherein the third memory is within the non-volatile memory.

11. An apparatus comprising:
a non-volatile memory including a group of storage elements;
a controller configured to send data to be programmed to the group of storage elements;
a set of latches configured to store the data during each particular stage of a multi-stage write operation; and
a second memory configured to store bits corresponding to one or more portions of the data during a time period between stages of the multi-stage write operation,
wherein the second memory is configured to receive the bits corresponding to the one or more portions of the data from the latches without receiving bits corresponding to a first portion of the data that is programmed to the group of storage elements during a first stage of the multi-stage write operation, and
wherein the latches are configured to receive the bits corresponding to the one or more portions of the data from the second memory and to receive the bits corresponding to the first portion of the data from the group of storage elements during a subsequent stage of the multi-stage write operation.

12. The apparatus of claim 11, further comprising mapping circuitry coupled to the latches, wherein the mapping circuitry is configured to modify the data in the latches, prior to the first stage, from a grey-type encoding to a binary-type encoding.

13. The apparatus of claim 12, wherein the mapping circuitry includes an exclusive-OR circuit to generate at least one value of the binary-type encoding of the data based on values of the grey-type encoding of the data.

14. The apparatus of claim 12, wherein the mapping circuitry is configured to perform a table lookup operation to determine at least one value of the binary-type encoding of the data based on values of the grey-type encoding of the data.

15. The apparatus of claim 11, wherein the second memory includes a single level cell (SLC) cache.

16. The apparatus of claim 11, further comprising a third memory configured to store one or more portions of the data.

17. The apparatus of claim 16, wherein the third memory includes a single level cell (SLC) cache.

18. The apparatus of claim 16, wherein the third memory is within the controller.

19. The apparatus of claim 16, wherein the third memory is within the non-volatile memory.

* * * * *